(12) United States Patent
Sri-Jayantha et al.

(10) Patent No.: US 7,781,883 B2
(45) Date of Patent: Aug. 24, 2010

(54) ELECTRONIC PACKAGE WITH A THERMAL INTERPOSER AND METHOD OF MANUFACTURING THE SAME

(75) Inventors: Sri M. Sri-Jayantha, Ossining, NY (US); Gerard McVicker, Stromville, NY (US); John U. Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 12/194,448

(22) Filed: Aug. 19, 2008

(65) Prior Publication Data

US 2010/0044856 A1 Feb. 25, 2010

(51) Int. Cl.
 *H01L 23/34* (2006.01)
(52) U.S. Cl. .................. 257/712; 257/704; 257/717; 257/E23.101; 438/109
(58) Field of Classification Search .............. 257/717, 257/E23.101, E23.5, 704, 712, E21.101, 257/E21.505; 438/109, 108
See application file for complete search history.

(56) References Cited

U.S. PATENT DOCUMENTS

| 6,442,026 B2 * | 8/2002 | Yamaoka .................. 361/704 |
| 2004/0169277 A1 | 9/2004 | Matsuda |
| 2007/0080454 A1 | 4/2007 | Hamaguchi |

* cited by examiner

*Primary Examiner*—Roy K Potter
(74) *Attorney, Agent, or Firm*—McGinn Intellectual Property Law Group, PLLC

(57) ABSTRACT

An electronic package includes a die including a thermal interface material through which a primary heat flux path is enabled for conducting heat from the die, an organic substrate, and a thermal interposer provided between the organic substrate and the die, the thermal interposer having an area extending beyond a footprint of the die, the area including the thermal interface material, the thermal interposer conducting heat generated by the die through the thermal interface material such that an auxiliary heat flux path for conducting heat generated in the die is enabled.

25 Claims, 11 Drawing Sheets

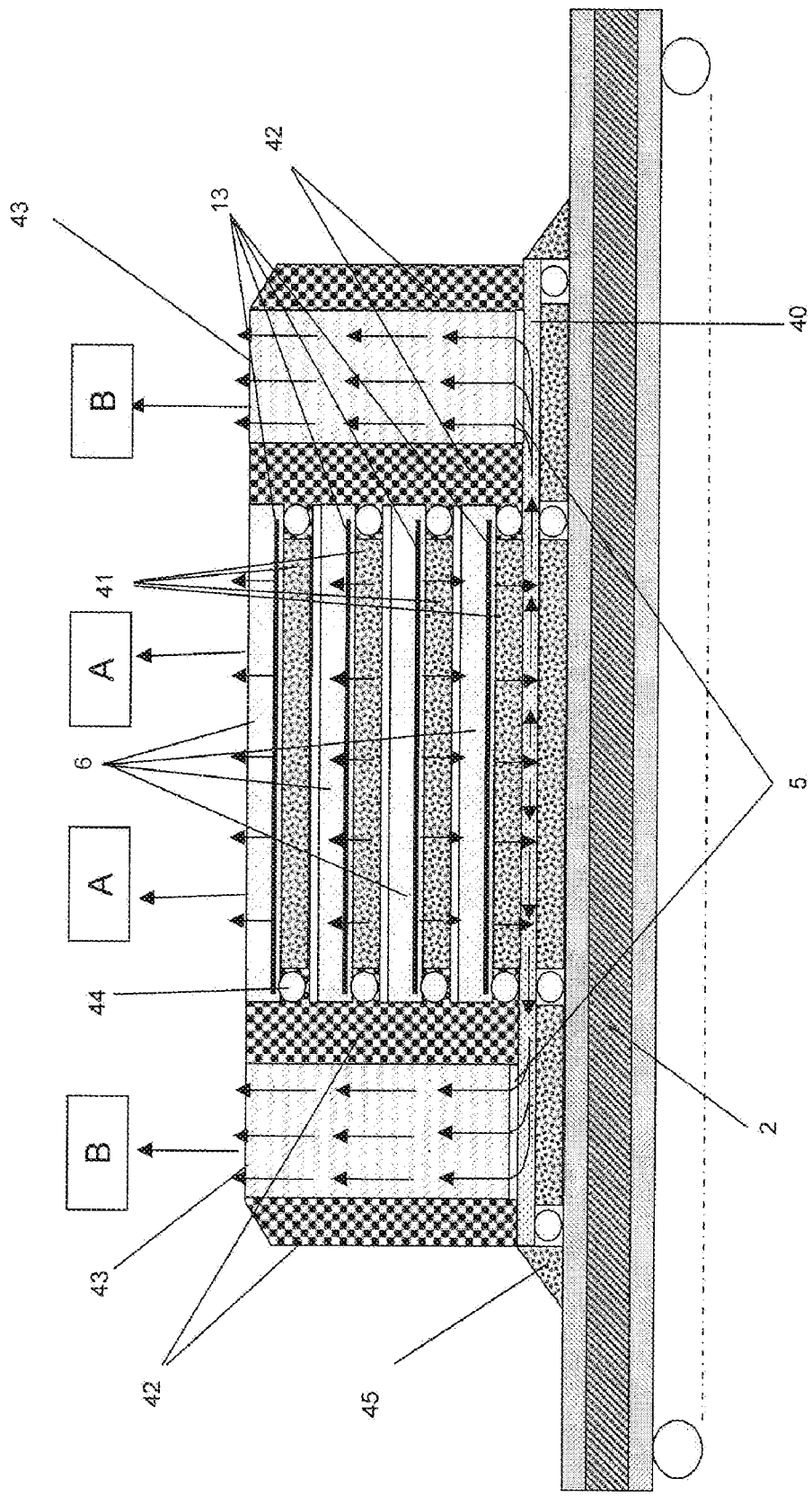

Figure 10
METHOD 100

101 — forming a die including a thermal interface material through which a primary heat flux path is enabled for generating heat from the die

102 — forming an organic substrate

103 — forming a thermal interposer provided between the organic substrate and the die, the thermal interposer having an area extending beyond a footprint of the die, the area including the thermal interface material, the thermal interposer conducting heat generated by the die through the thermal interface material such that an auxiliary heat flux path for conducting heat generated in the die is enabled

ELECTRONIC PACKAGE WITH A THERMAL INTERPOSER AND METHOD OF MANUFACTURING THE SAME

BACKGROUND OF THE INVENTION

1. Field of the Invention

The present invention generally relates to an electronic package with a thermal interposer, and more specifically to an electronic package where a thermal interposer provides an improved thermal resistance and retains the mechanical advantages of a conventional interposer.

2. Description of the Related Art

Thermal efficiency is critical to achieving higher performance in computer chips. Achieving such thermal efficiency becomes more challenging as semiconductor electronics are being fabricated to provide a maximum amount of capability in as small a package or "footprint" as possible. In order to prevent temperature-sensitive circuits from being negatively affected by high thermal conditions, various cooling systems have been implemented in association with electronic packages.

FIG. 1 shows elements of a conventional electronic package integrated with a cooling solution. In FIG. 1, a vapor chamber heat sink 1 is formed on a surface of a multi-layer organic substrate 2. The substrate 2 is electrically connected to a printed circuit board 3 by a ball grid array 4. A thermal interface material (TIM) 5 connects the heat sink 1 with a die ("chip") 6. Underfill 8, applied underneath and to the side of the die 6, protects a C4 (Controlled Collapse Chip Connector) area 9 that connects the die 6 to the substrate 2.

In the conventional package of FIG. 1, through the connection of the heat sink 1 and the die 6 by the thermal interface material 5, the heat sink 1 is able to remove more than 90% of heat generated through an upper silicon surface of the die 6. Polymer-based material in the organic substrate 2 limits the flow of heat through a bottom side of the die 6 since a thermal conductivity of the polymeric material in the organic substrate 2 is significantly lower than components formed with silicon or copper.

However, the remaining (or residual) 10% of the heat is inadvertently lost through the bottom side of the die 6 and is applied to areas designed for electrical interconnection but not optimized for thermal conduction, such as the ball grid array 4, the C4 area 9, and active layers of the die 6. Due to the poor thermal conductivity of the organic substrate 2, the inadvertently lost (thermal) heat energy becomes trapped in circuits where additional heat energy is not desired. Temperature-sensitive circuits especially suffer from this defect. Further, with all the heat energy being concentrated in the die 6 for escape purposes, a quality location to place temperature-sensitive circuits on the die 6 cannot be found.

FIG. 2 shows a configuration of a conventional electronic package where a conventional interposer 10 with a plurality of through vias 11 is sandwiched between a die 6 and the organic substrate 2. The substrate 2 is connected to the thermal interposer 10 by a C4 layer 9. The interposer 10 is also connected to the die 6 by a micro C4 layer 12. Underfill 8 is used to fill gaps in electrical connections made between the interposer 10, the die 6, and the organic substrate 2. The underfill 8 is formed between a surface of the substrate 2 and a surface of the die 6. Conventional underfills are generally not good thermal conductors, but help to distribute the mechanical stresses away from C4 areas.

With respect to FIG. 2, the intent of the interposer 10 is to favorably distribute mechanical stress seen by a device layer in the die 6 that occurs due to a mismatch in the coefficient of thermal expansion (CTE) between the organic substrate 2 and the die 6. A typical die has a CTE of 3 ppm per ° C., while a typical organic substrate has a CTE of approximately 18 ppm per ° C. Thus, application of heat to the organic substrate 2 and the die 6 can cause the organic substrate 2 to expand six times more than the die 6. The differential expansion of the die 6 and the substrate 10 generates large shear stress at the respective mating surfaces of the underfill. Also, the shear stress is then transferred to a device layer (not shown), where the stress could cause the cracking of transistors fabricated within the device layer. Chip warp and deformation also occur due to differential expansion.

The planar area (or footprint) of a conventional interposer 10 matches that of the die 6. In this configuration, when the CTE of the die 6 and conventional interposer 10 are matched, the interposer 10 provides a mechanical advantage. The shear stress is minimized due to reduced differential expansion. The favorable distribution of mechanical stress can increase the reliability of both the micro-C4 layer 12 and the device layer. However, the C4 layer 9 is not protected because the differential expansion between the organic substrate 2 and the conventional interposer 10 is not reduced by this configuration.

The effects of a conventional interposer on warping of the chip are demonstrated in FIG. 3. Specifically, as shown, when a die has a diagonal distance of around 13 mm and is not influenced by a conventional interposer, the typical chip warp reaches around 90 μm. On the contrary, when a conventional interposer is fabricated of silicon and is introduced between a die and an organic substrate, the chip warp is significantly reduced. For example, with the conventional interposer made of silicon, at the same diagonal distance as specified for the die above, the chip warp reaches around 55 μm, which is a reduction of 39% from a chip not having a conventional interposer.

The effects of a conventional interposer on mechanical stress are demonstrated in FIG. 4. Specifically, as shown, when a die is not influenced by a conventional interposer, a principal device stress, which is the stress in a device layer, is around 45 MPa, and a device peak corner shear stress, which is the shear stress in a device layer, is around 73 MPa. On the contrary, when a conventional interposer having a 50 μm thickness of silicon is introduced into a relationship between a die and an organic substrate, a device principal stress drops by 31% to about 30 MPa and a device peak corner shear stress drops by 58% to about 32 MPa.

While additional thickness fails to substantially affect the device principal stress, the device peak corner shear stress is significantly affected by an increased thickness of a conventional interposer. Specifically, where a thermal interposer having a 730 μm thickness of silicon is introduced in between a die and an organic substrate, a device principal stress drops slightly to about 28 MPa. The device peak corner stress, on the other hand, drops to about 1 MPa. Therefore, while the principal stress is not significantly affected by further increases in silicon thickness, an increase in silicon thickness still can further prevent the chip warp by significantly decreasing the device peak corner stress.

While the conventional interposer including silicon has all increased principal stress level pursuant to the thickness of the interposer, such an increase in principal stress, even where a conventional interposer is made of 730 μm thick silicon and experiences 80 MPa of principal stress, is perfectly acceptable. The silicon interposer can withstand a level of stress around 200 MPa without developing a crack. In this situation, the interposer is simply acting as a buffer modulating the difference in CTE between the organic substrate and die, and has no active device layer to risk any failure.

Nevertheless, as is shown in FIG. 5, despite all the mechanical benefits and advantages of including a conventional interposer in an electronic package, the conventional interposer fails to substantially contribute to a steady state thermal enhancement of the chip.

FIG. 5 shows a configuration of a conventional electronic package as is shown in FIG. 2 where a conventional interposer 10 with a plurality of through vias 11 is sandwiched between a die 6 and an organic substrate 2. The substrate 2 is connected to the conventional interposer 10 by a C4 layer 9. The conventional interposer 10 is also connected to a device layer 13 of the die 6 by a micro C4 layer 12. The die 6 is formed on a surface of the device layer 13, and a thermal interface material 5 is formed on a surface of the die 6. Underfill 8 is used to fill gaps surrounding the electrical connections of the C4 9 and micro C4 12 layers made between the conventional interposer 10, the die 6, and the organic substrate 2.

However, FIG. 5 shows that, despite the ability of the conventional interposer 10 to reduce stress associated with CTE in an electronic package, the conventional interposer 10 fails to positively influence conventional heat flux path A to reduce the amount of heat that is inadvertently lost and escaping through the bottom portion of the die. In fact, the conventional interposer 10 slightly reduces an amount of residual heat conducted through the organic substrate 2 by increasing a thermal resistance.

SUMMARY OF THE INVENTION

In view of the foregoing and other exemplary problems, drawbacks, and disadvantages of the conventional methods and structures, an exemplary object of the present invention is to provide an electronic package with a thermal interposer where the electronic package possesses an improved thermal resistance due to the implementation of a thermal interposer for augmenting an additional heat transfer path while retaining mechanical advantages of the thermal interposer.

A first exemplary embodiment of the present invention includes an electronic package including a die including a thermal interface material through which a primary heat flux path is enabled for conducting heat from the die, an organic substrate, and a thermal interposer provided between the organic substrate and the die, the thermal interposer having an area extending beyond a footprint of the die, the area comprising the thermal interface material, the thermal interposer conducting heat generated, by the die through the thermal interface material such that an auxiliary heat flux path for conducting heat generated in the die is enabled.

In an exemplary aspect of the first exemplary embodiment of the present invention, the auxiliary heat flux path reduces a temperature primarily at a periphery of the die such that temperature-sensitive circuits can be located at the periphery of the die.

In an exemplary aspect of the first exemplary embodiment of the present invention, the primary heat flux path and the auxiliary heat flux path releases heat to a heat sink.

In an exemplary aspect of the first exemplary embodiment of the present invention, the thermal interface material interfaces with a heat sink.

In an exemplary aspect of the first exemplary embodiment of the present invention, the electronic package further includes a device layer provided between the die and the thermal interposer. The auxiliary heat flux path reduces a temperature at a periphery of the device layer such that temperature-sensitive circuits can be placed at the periphery of the device layer.

In an exemplary aspect of the first exemplary embodiment of the present invention, the thermal interposer includes an interposer material having a coefficient of thermal expansion similar to that of silicon, a high thermal conductivity, and a suitability for one of chemical etching and drilling. The coefficient of thermal expansion of the interposer material is substantially similar to a coefficient of thermal expansion of the die.

In an exemplary aspect of the first exemplary embodiment of the present invention, the interposer material includes silicon.

In an exemplary aspect of the first exemplary embodiment of the present invention, the die and the organic substrate have a difference in coefficients of thermal expansion. The thermal interposer mitigates stress inherently caused by the differential expansion between the die and the organic substrate.

In an exemplary aspect of the first exemplary embodiment of the present invention, a thickness of the thermal interposer affects the temperature at the periphery of the die.

In an exemplary aspect of the first exemplary embodiment of the present invention, a thermal conductivity of the auxiliary path is dependent upon a width of said thermal interposer.

A second exemplary embodiment of the present invention includes an electronic package, including a die including a thermal interface material through which a primary heat flux path is enabled for conducting heat from the die, an organic substrate, a thermal interposer provided between the organic substrate and the die, the thermal interposer having an area extending beyond a footprint of the die, the area including the thermal interface material, and an augmenting element formed on the thermal interface material of the area. The thermal interposer conducts heat generated by the die through the thermal interface material and the augmenting element such that an auxiliary heat flux path for conducting heat generated in the die is enabled.

In an exemplary aspect of the second exemplary embodiment of the present invention, the augmenting element includes a micro-channel cooler.

In an exemplary aspect of the second exemplary embodiment of the present invention, the electronic package further includes a device layer provided between the die and the thermal interposer. The auxiliary heat flux path reduces a temperature at a periphery of the device layer such that temperature-sensitive circuits can be placed at the periphery of the device layer.

In an exemplary aspect of the second exemplary embodiment of the present invention, the primary heat flux path and the auxiliary heat flux path conducts heat to a heat sink.

In an exemplary aspect of the second exemplary embodiment of the present invention, the thermal interface material of the die interfaces with a heat sink. The augmenting element interfaces with the heat sink.

A third exemplary embodiment of the present invention includes an electronic package, including a plurality of dies stacked three-dimensionally through which a primary heat flux path is enabled for conducting heat from the plurality of dies, an organic substrate, and a thermal interposer provided between the organic substrate and the plurality of dies, the thermal interposer having an area extending beyond a footprint of the plurality of dies, the thermal interposer including a vertical thermal piston formed on a thermal interface material provided on a first portion of the area, the piston including highly conductive material, and a plurality of molded portions provided on a second portion of the area, the plurality of molded portions surrounding the piston. The thermal interposer conducts heat generated by the die through the thermal interface material and the thermal pistons such that an auxiliary heat flux path for conducting heat generated in the die is enabled.

In an exemplary aspect of the third exemplary embodiment of the present invention, the molded portions and the pistons are level with a top surface of an uppermost die of the plurality of dies.

In an exemplary aspect of the third exemplary embodiment of the present invention, the molded portions include one of a polished and leveled surface such that the molded portions have a flat, uniform surface for interface with a heat sink.

In an exemplary aspect of the third exemplary embodiment of the present invention, the auxiliary heat flux path reduces a temperature at a periphery of the plurality of dies such that temperature-sensitive circuits can be located at the periphery of the plurality of dies.

In an exemplary aspect of the third exemplary embodiment of the present invention, the electronic package further includes a device layer provided in the plurality of dies. The auxiliary heat flux path reduces a temperature at a periphery of the device layer such that temperature sensitive circuits can be placed at the periphery of the device layer.

A fourth exemplary embodiment of the present invention includes a method of manufacturing an electronic package, including forming a die including a thermal interface material through which a primary heat flux path is enabled for conducting heat from the die, forming an organic substrate, and forming a thermal interposer provided between the organic substrate and the die, the thermal interposer having an area extending beyond a footprint of the die, the area comprising the thermal interface material, the thermal interposer conducting heat generated by the die through the thermal interface material such that an auxiliary heat flux path for conducting heat generated in the die is enabled.

In an exemplary aspect of the fourth exemplary embodiment of the present invention, the auxiliary heat flux path reduces a temperature at a periphery of the die such that temperature-sensitive circuits can be located at the periphery of the die.

In an exemplary aspect of the fourth exemplary embodiment of the present invention, the method of manufacturing an electronic package includes forming a device layer between the die and the thermal interposer. The auxiliary heat flux path reduces a temperature at a periphery of the device layer such that temperature-sensitive circuits can be placed at the periphery of the device layer.

In an exemplary aspect of the fourth exemplary embodiment of the present inventions the method of manufacturing an electronic package includes forming an augmenting element on the thermal interface material of the area. The thermal interposer conducts heat generated by the die through the thermal interface material and the augmenting element such that the auxiliary heat flux path for conducting heat generated in the die is enabled.

In an exemplary aspect of the fourth exemplary embodiment of the present invention, the method of manufacturing an electronic package includes forming a plurality of dies stacked three-dimensionally through which the primary heat flux path is enabled for conducting heat from the plurality of dies, the plurality of dies including the die, forming a vertical thermal piston on the thermal interface material provided on a first portion of the area, the piston including highly conductive material, and forming a plurality of molded portions on a second portion of the area, the plurality of molded portions surrounding the piston. The thermal interposer conducts heat generated by the plurality of dies through the thermal interface material and the thermal pistons such that the auxiliary heat flux path for conducting heat Generated in the plurality of dies is enabled.

According to an exemplary aspect of the present invention, the thermal interposer of the present invention extends beyond a footprint area of the die. This extension allows heat dissipated by the die to take two distinct (e.g., separate, independent) heat flux paths A and B. Thus, the thermal interposer of the present invention promotes and allows the escape of heat energy toward this auxiliary heat flux path B in order to prevent the inadvertent transfer of heat energy to, and trapping of heat energy in, areas where heat energy is desired the least. Moreover, a quality location on the die can also be found for placing temperature-sensitive circuits due to the lower amount of heat dissipation occurring in the primary heat flux path A and the distribution of heat management between primary heat flux path A and auxiliary heat flux path B.

Further, in addition to the thermal interposer of the present invention's exemplary thermally advantageous benefits, the thermal interposer still retains the previously mentioned exemplary positive characteristics with respect to stress management within an electronic package.

BRIEF DESCRIPTION OF THE DRAWINGS

The foregoing and other exemplary purposes, aspects and advantages will be better understood from the following detailed description of exemplary embodiments of the invention with reference to the drawings, in which:

FIG. 9A illustrates another exemplary embodiment of an electronic package including a thermal interposer of the present invention with respect to a die stack;

FIG. 10 illustrates an exemplary embodiment of a method of manufacturing an electronic package including a thermal interposer of the present invention.

DETAILED DESCRIPTION OF EXEMPLARY EMBODIMENTS OF THE INVENTION

Figure 1:
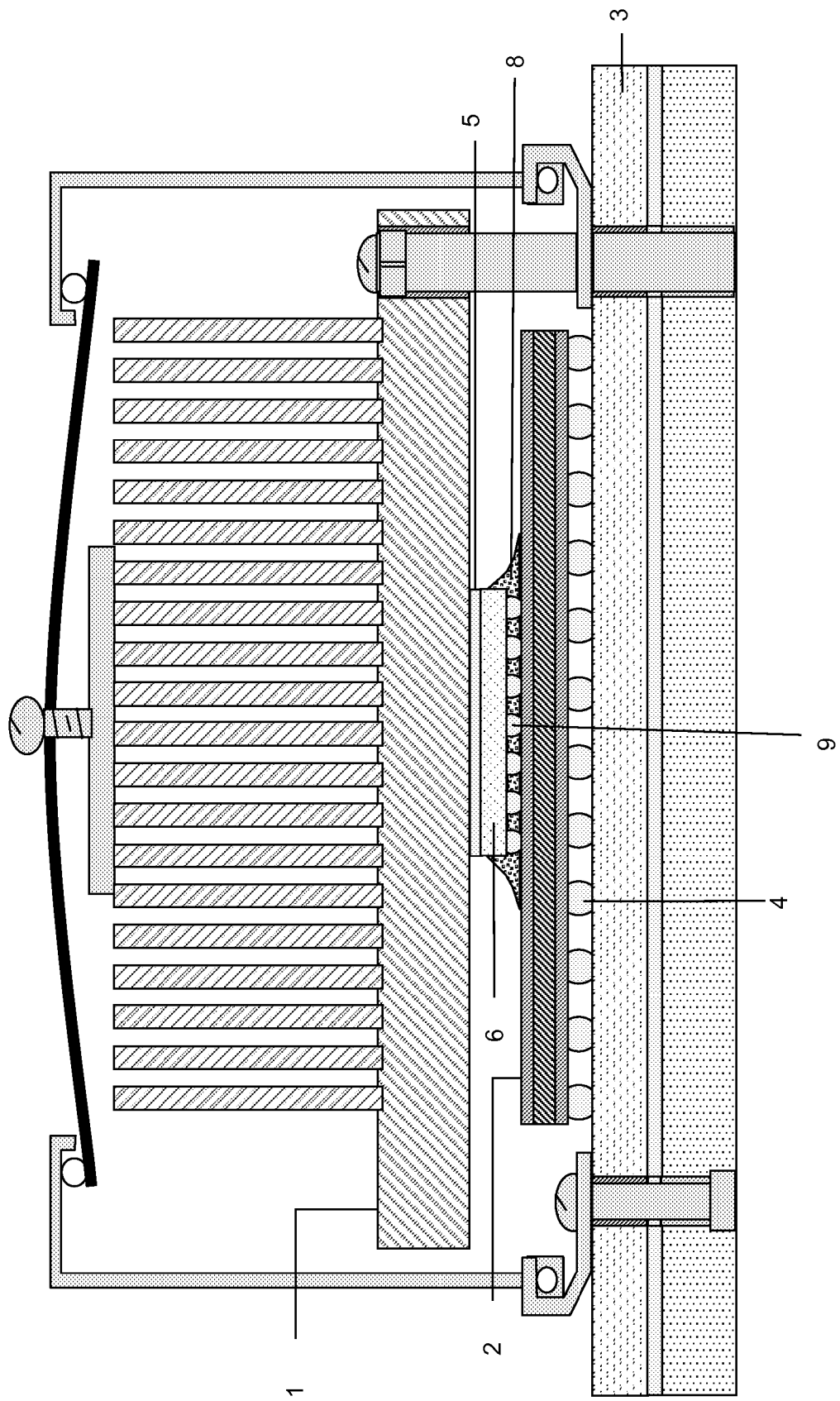
FIG. 1 illustrates a conventional electronic package with an integrated cooling solution.

Referring now to the drawings, and more particularly to FIGS. 6-10, there are shown exemplary embodiments of the structures and method according to the present invention.

The present invention serves to address and limit the inadvertent transfer of heat to unwanted areas, such as electronic connections. Heat energy not transferred out of an upper surface of a die was conventionally inadvertently transferred to areas where increases in heat energy were unwanted, such as areas of electronic connection.

Further, the heat energy conventionally inadvertently transferred to unwanted areas was conventionally further trapped and restricted to these unwanted areas by multi-layer organic substrates that are conventionally and presently designed to be relatively poor conductors. Thus, the inadvertently transferred heat energy has no escape from the areas in which heat energy was least desired.

As previously mentioned, conventional interposers have been normally used only to absorb mechanical stresses between a die and an organic substrate to mitigate solder joint fatigue. Thermal interposers have conventionally not been used as enablers of heat transfer within an electronic package.

Figure 5:
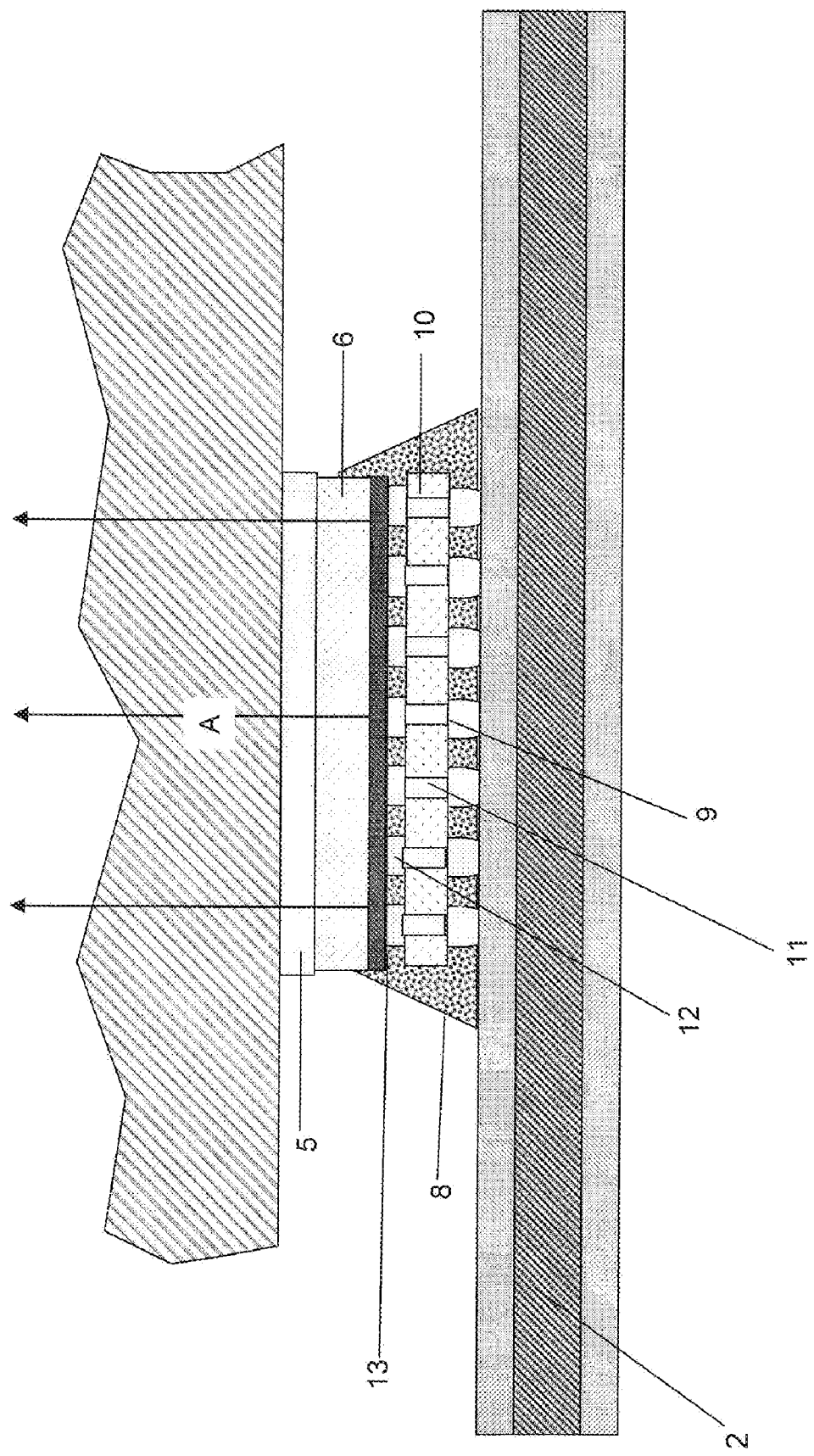
FIG. 5 illustrates the conventional electronic package of FIG. 2 with an effect of the conventional interposer on a conventional heat flux path.
Figure 6:
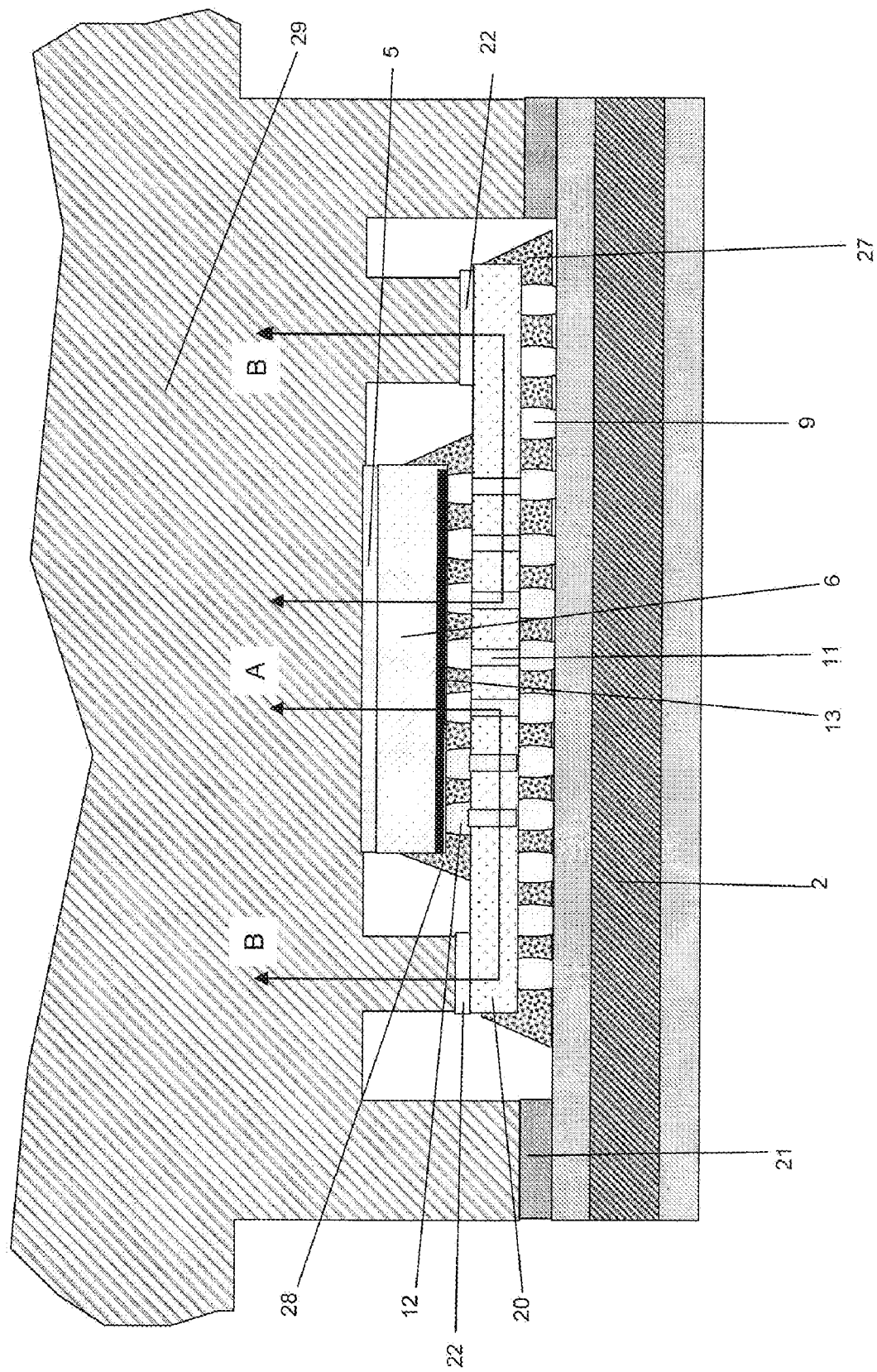
FIG. 6 illustrates an exemplary embodiment of an electronic package including a thermal interposer of the present invention.

FIG. 6 includes an electronic package including a thermal interposer 20 of the present invention. As was the case in the electronic package shown in FIG. 5, a thermal interposer 20 with a plurality of through vias 11 is sandwiched between a die 6 and the organic substrate 2. The substrate 2 is connected to the thermal interposer 20 by a C4 layer 9. The thermal interposer 20 is also connected to a device layer 13 of the die 6 by a micro C4 layer 12. The die 6 is formed on a surface of the device layer 13, and a thermal interface material 5 is formed on a surface of the die 6. The thermal interface material 5 interfaces with a heat sink 29.

An interposer thermal interface material 22 that also interfaces with the heat sink 29 is formed on a portion of the thermal interposer 20. A lid adhesive 21 is used to secure the heat sink 29 to the organic substrate 2. A first portion of underfill 27 surrounds a surface of the thermal interposer 20 that is connected to the organic substrate 2. A second portion of underfill 28 surrounds a surface of the thermal interposer 20 that is connected to the device layer 13.

Figure 2:
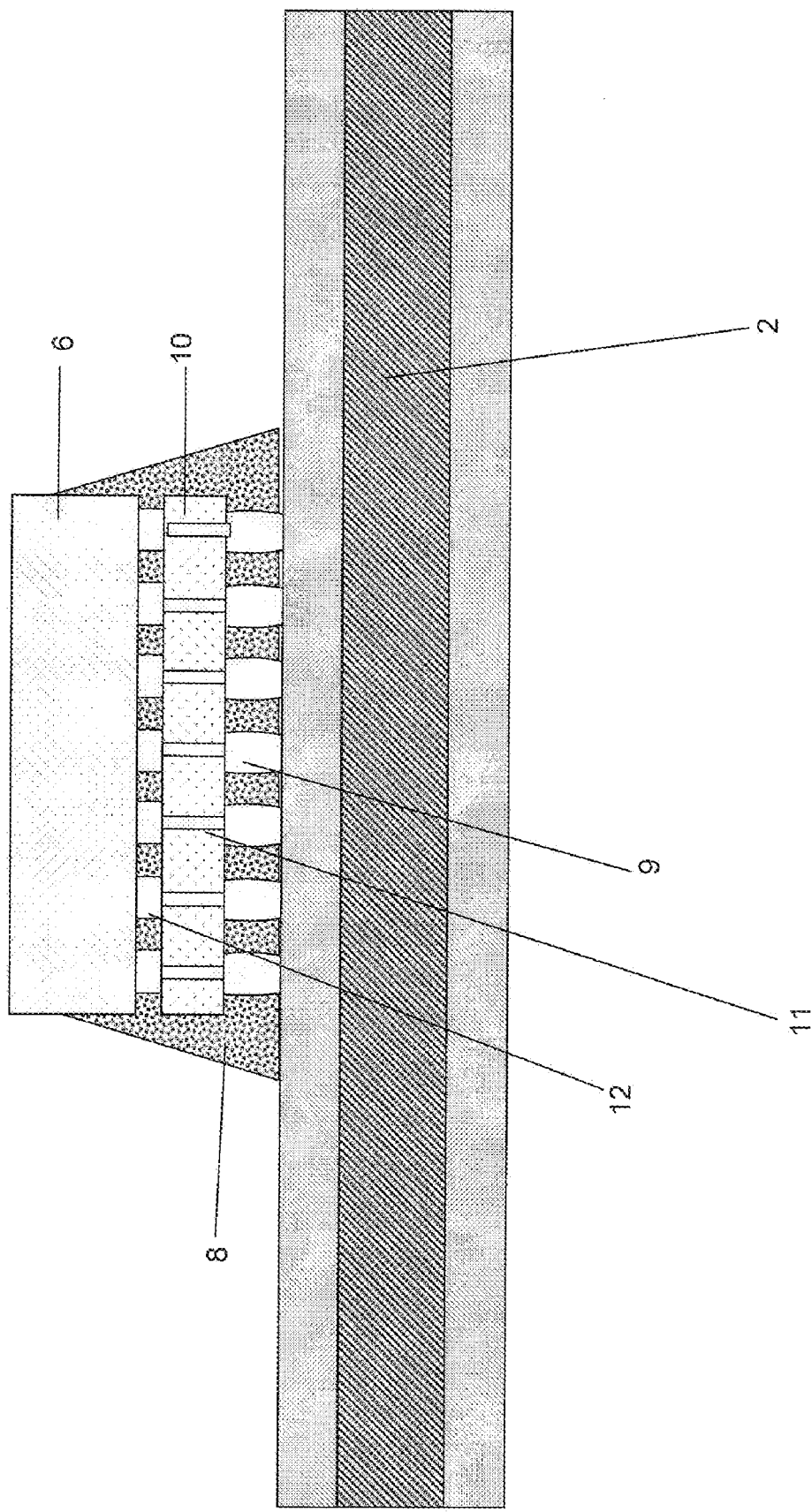
FIG. 2 illustrates a conventional electronic package that includes a conventional interposer sandwiched between a die and an organic substrate.
Figure 3:
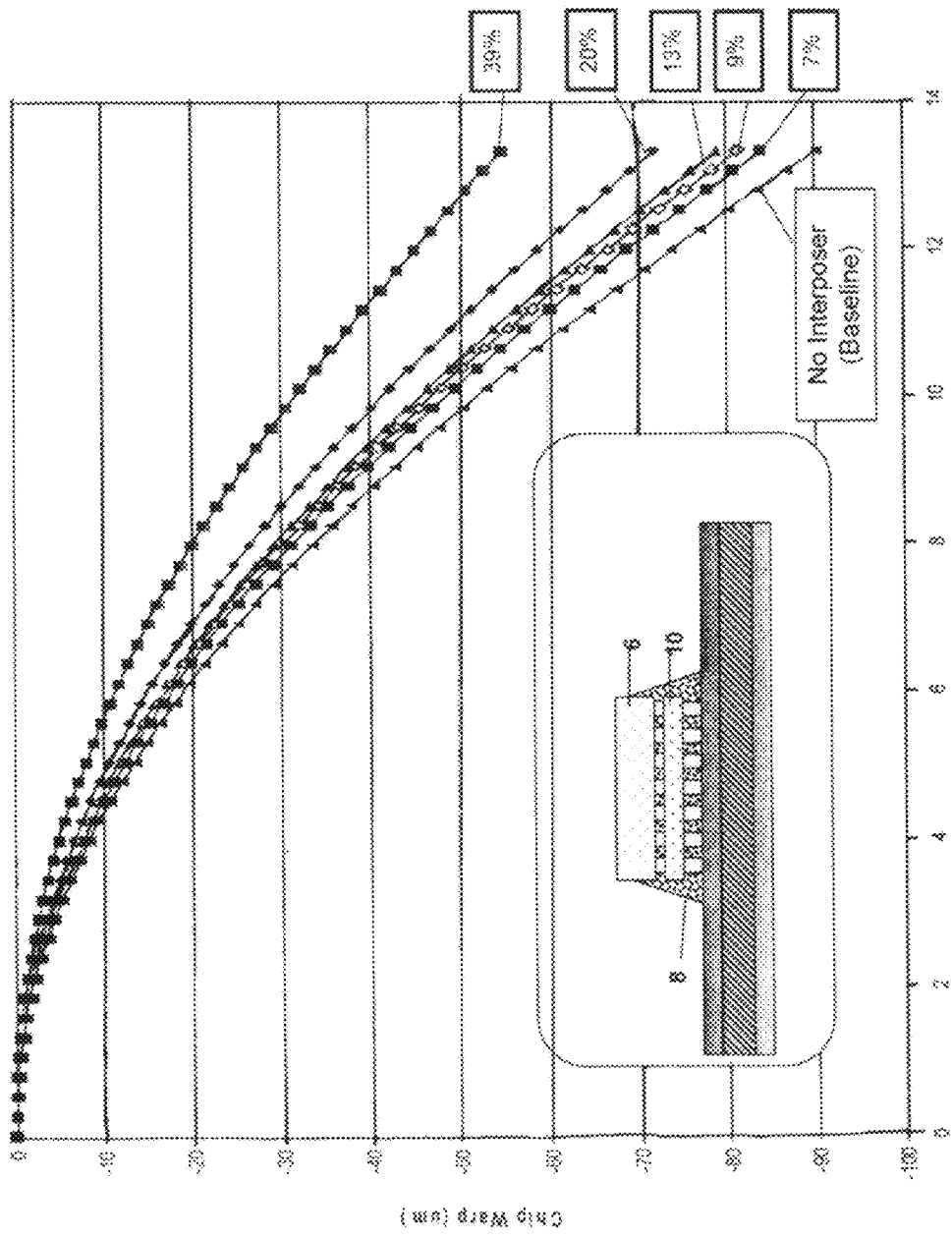
FIG. 3 illustrates an effect of a conventional interposer on a chip warp of a die of the conventional electronic package.
Figure 4:
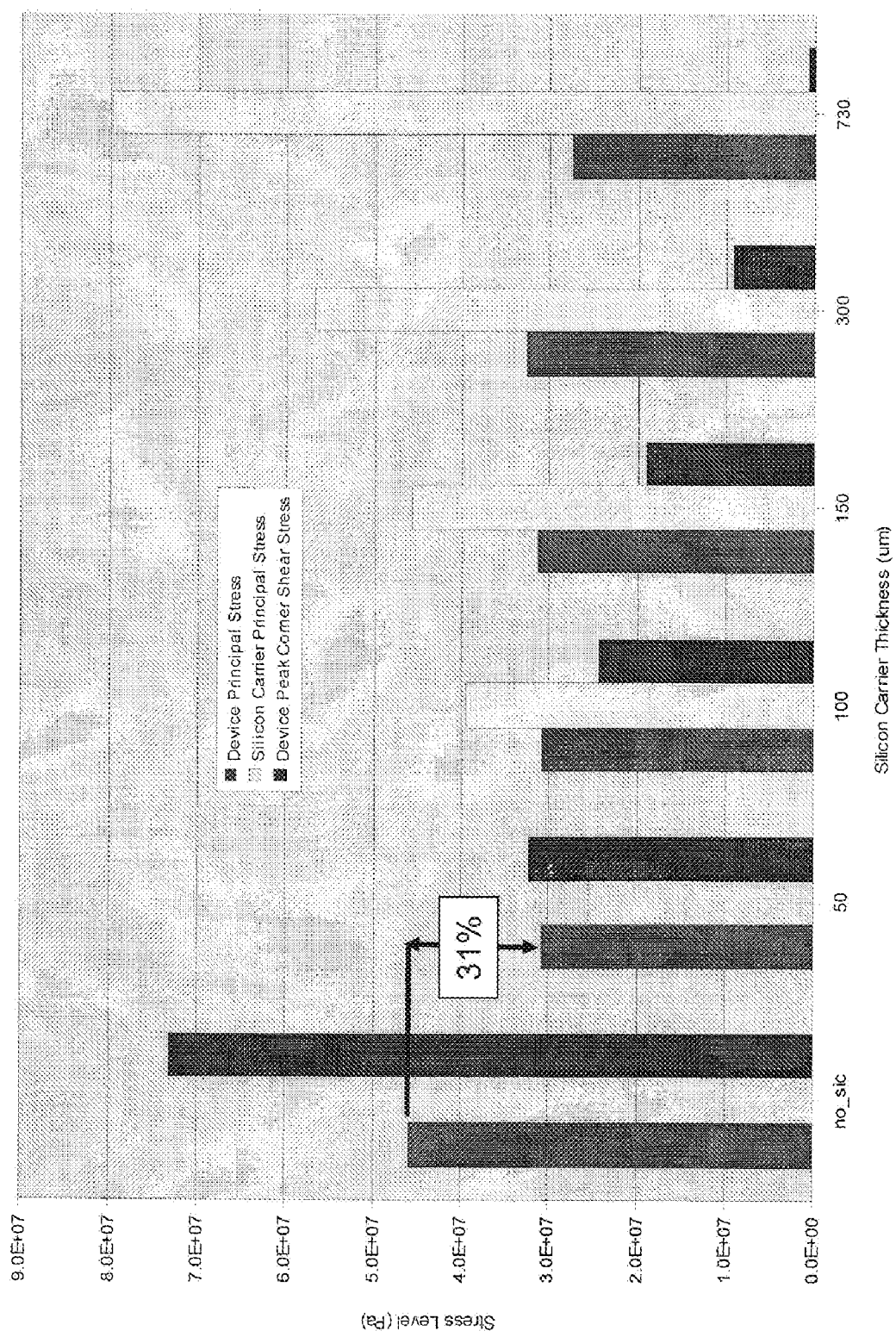
FIG. 4 illustrates an effect of a conventional interposer on stress levels on a die of the conventional electronic package.

However, contrary to the conventional interposer 10 of FIGS. 2 and 5, the thermal interposer 20 of FIG. 6 extends beyond a footprint area of the die 6. This extension allows heat dissipated by the die 6 to take two distinct (i.e., separate, independent) heat flux paths A and B.

Path A is still maintained as a primary heat flux path from an upper portion of the die 6 having thermal interface material 5 connected to the heat sink 29. However, the thermal interposer 20, in conjunction with the interposer thermal interface material 22 formed on a portion of the thermal interposer 20, allows the creation of an auxiliary heat flux path B that also transfers heat to the heat sink 29.

Thus, the thermal interposer 20 of the present invention promotes and allows the escape of heat energy toward this auxiliary heat flux path B in order to prevent the inadvertent transfer of heat energy to, and the trapping of, heat energy in areas where heat energy is desired the least. Moreover, a quality location on the die 6 can also be found for placing temperature-sensitive circuits due to the lower amount of heat dissipation occurring in the primary heat flux path A and the distribution of heat management between primary heat flux path A and auxiliary heat flux path B.

Further, in addition to the thermal interposer 20 of the present invention's exemplary thermally advantageous benefits, the thermal interposer 20 still retains the previously mentioned exemplary positive characteristics with respect to stress management within an electronic package.

Specifically, while also providing the newly detailed exemplary thermal advantages, the thermal interposer 20 of the present invention still functions as a buffer between the die 6 and the organic substrate 2 to absorb stresses generated by differences in the CTE of the organic substrate 2 and the die 6. The CTE of the thermal interposer 20 and the die 6 are substantially the same. Thus, stresses normally causing cracking and warping throughout active areas of an electronic package have been interrupted and buffered by the thermal interposer 20 such that effects caused by the CTE mismatch are dramatically reduced.

The thermal interposer 20 includes a material that possesses a CTE close to that of silicon, has a high thermal conductivity, and is amenable to fabrication of through vias for electrical connection. An exemplary aspect of the present invention includes the thermal interposer 20 including silicon, BeO, AlN, SiC, composite material, copper/composite and/or graphite. While the present invention is not limited to any one specific extension length, an exemplary aspect of the present invention includes a 5 mm extension of the thermal interposer 20 beyond edges of the die 6. Also, the improvement in effective thermal resistance is controlled largely by a thickness of the thermal interposer 20 rather than an extension length of the thermal interposer 20. In addition, a thermal conductivity of the auxiliary path B is dependent on the width of the thermal interposer 20. Further, means other than a lid adhesive 21 can be utilized to attach a heat sink to the organic substrate 2, such as a configuration to secure the organic substrate 2 to the heat sink 1 as shown in FIG. 1.

TABLE 1

Material Properties and Geometry

| Part | Material | k (W/m-C) | CTE ppm/C | X Dim (mm) | Y Dim (mm) | Z Dim (mm) |
|---|---|---|---|---|---|---|
| Die | Silicon | 129 | 3 | 21.1 | 16.2 | 0.785 |
| Laminate Build Up | Polymer Composite | 0.35 | 18 | 50 | 50 | 0.236 |
| Laminate Core | Polymer Composite | 0.73 | 18 | 50 | 50 | 0.650 |
| TIM 1 | Thermal Gel | 4 | — | Die area | Die area | 0.030 |
| Interposer | Silicon | 129 | 3 | 33.1 | 28.2 | 0.150 |
| Underfill/ Fillets | Industry standard | 1.3 | — | Typical | Typical | 0.75 |
| Lid | Copper | 385 | 17 | Standard Design | Standard Design | 2 (over die) |
| Lid Adhesive | Sylgard | 3 | — | 4 | 4 | 0.19 |

Table 1 summarizes design parameters used to evaluate an exemplary embodiment of the present invention. It is important to note that an exemplary aspect of the present invention includes a thermal interposer 20 having a substantially equivalent CTE value as a die 6. It is also important to note that an exemplary aspect of the present invention includes a thermal interposer 20 that is extended 6 mm from all sides of a die 6.

Figure 7:
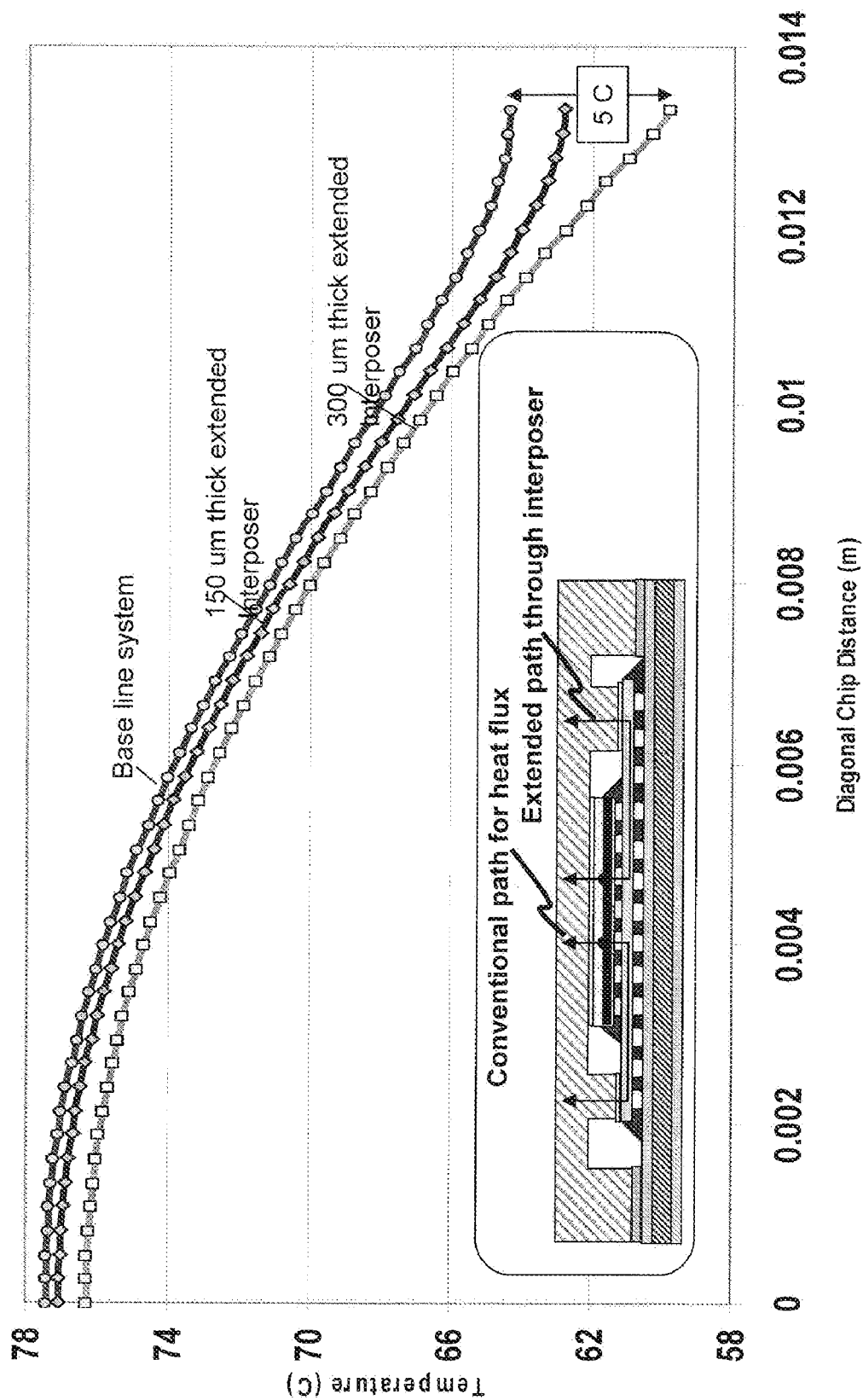
FIG. 7 illustrates an effect of an exemplary embodiment of the thermal interposer of the present invention with regard to a device level temperature along a chip diagonal.

FIG. 7 shows the effect of the thermal interposer 20 of the present invention with regard to a device level temperature along a chip diagonal for two exemplary thermal interposer thickness values. 150 μm and 300 μm. The base line system represents a conventional unit where, as is shown in FIGS. 2 and 5, the conventional interposer 10 is not extended beyond edges of the die, the conventional interposer 10 is not connected via thermal interface material to a heat sink, and only the die is connected via thermal interface material to a heat sink. The other two systems represent exemplary embodiments of the present invention, where the thermal interposer 20 of the present invention, as is exemplary shown in FIG. 6, is provided at either a thickness of 150 μm or 300 μm.

The results demonstrate the advantages of the thermal interposer 20 of the present invention with regard to temperature control throughout the chip diagonal. The thermal interposer 20 of the present invention provides a temperature reduction of as much as 5° C. in peripheral locations of the die 6 compared to the conventional unit.

In an exemplary aspect of the present invention, heat energy still prefers to escape from the die 6 in a center zone of the die 6. However, while this preference of the heat energy diminishes the advantage of the thermal interposer 20 of the present invention toward the center zone of the die 6, a reduction of as much as 1.5° C. is still obtained near the center zone of the die 6. Thus, temperature-sensitive circuits, such as i.e., ring oscillators, on the die 6 can be moved to an edge portion of the die 6 and still take advantage of heat management provided by the thermal interposer 20.

Figure 8:
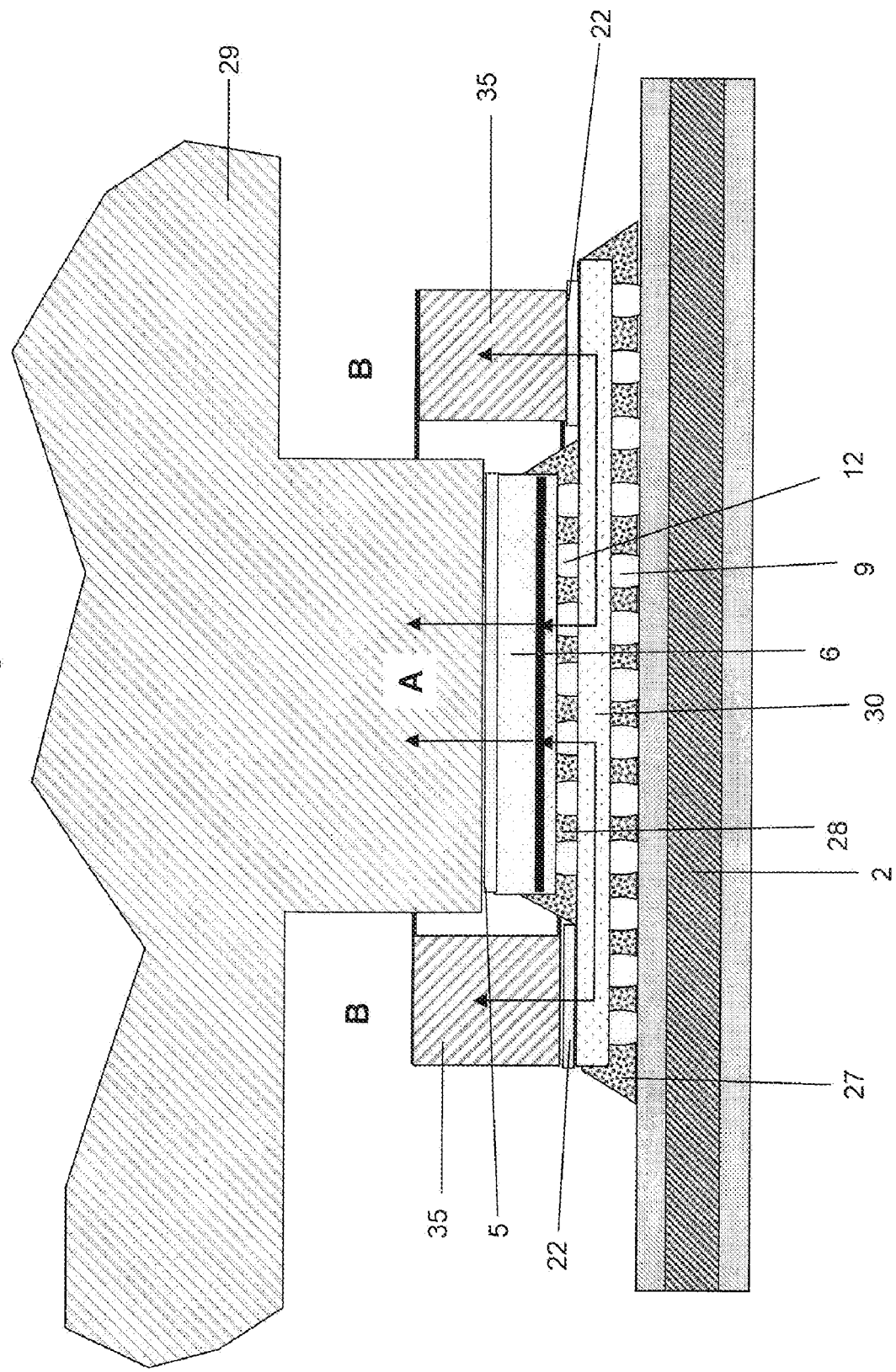
FIG. 8 illustrates another exemplary embodiment of an electronic package including a thermal interposer of the present invention.

FIG. 8 illustrates another exemplary embodiment of the present invention where the thermal interposer 30 of the present invention is coupled to a highly efficient and miniaturized element that further augments and supports the thermal interposer 30 in providing an alternate flux path B to the primary flux path A.

Similarly to FIG. 6, FIG. 8 exemplary includes an electronic package including a thermal interposer 30 of the present invention. As was the case in the electronic package shown in FIG. 6, a thermal interposer 30 is sandwiched between a die 6 and the organic substrate 2. The substrate 2 is connected to the thermal interposer 30 by a C4 layer 9. The thermal interposer 30 is also connected to the die 6 by a micro C4 layer 12. A thermal interface material 5 is formed on a surface of the die 6. The thermal interface material 5 interfaces with a heat sink 29.

An interposer thermal interface material 22 that also interfaces with a heat sink element 35 is formed on a portion of the thermal interposer 30. A first portion of underfill 27 surrounds a surface of the thermal interposer 30 that is connected to the organic substrate 2. A second portion of underfill 28 surrounds a surface of the thermal interposer 30 that is connected to the die 6.

In the exemplary embodiment of the present invention as shown in FIG. 8, a highly efficient and miniaturized element 35 that further augments and supports the thermal interposer 30 in providing an alternate flux path B to the primary flux path A is provided. While there are no restrictions regarding the aforementioned highly efficient and miniaturized element, an exemplary embodiment of such an element is provided in FIG. 8 as a micro-channel cooler. According to this exemplary embodiment, a highly reduced temperature distribution in the periphery of the die 6 is achievable, thus further enabling additional placement of temperature-sensitive circuits.

Figure 9B:
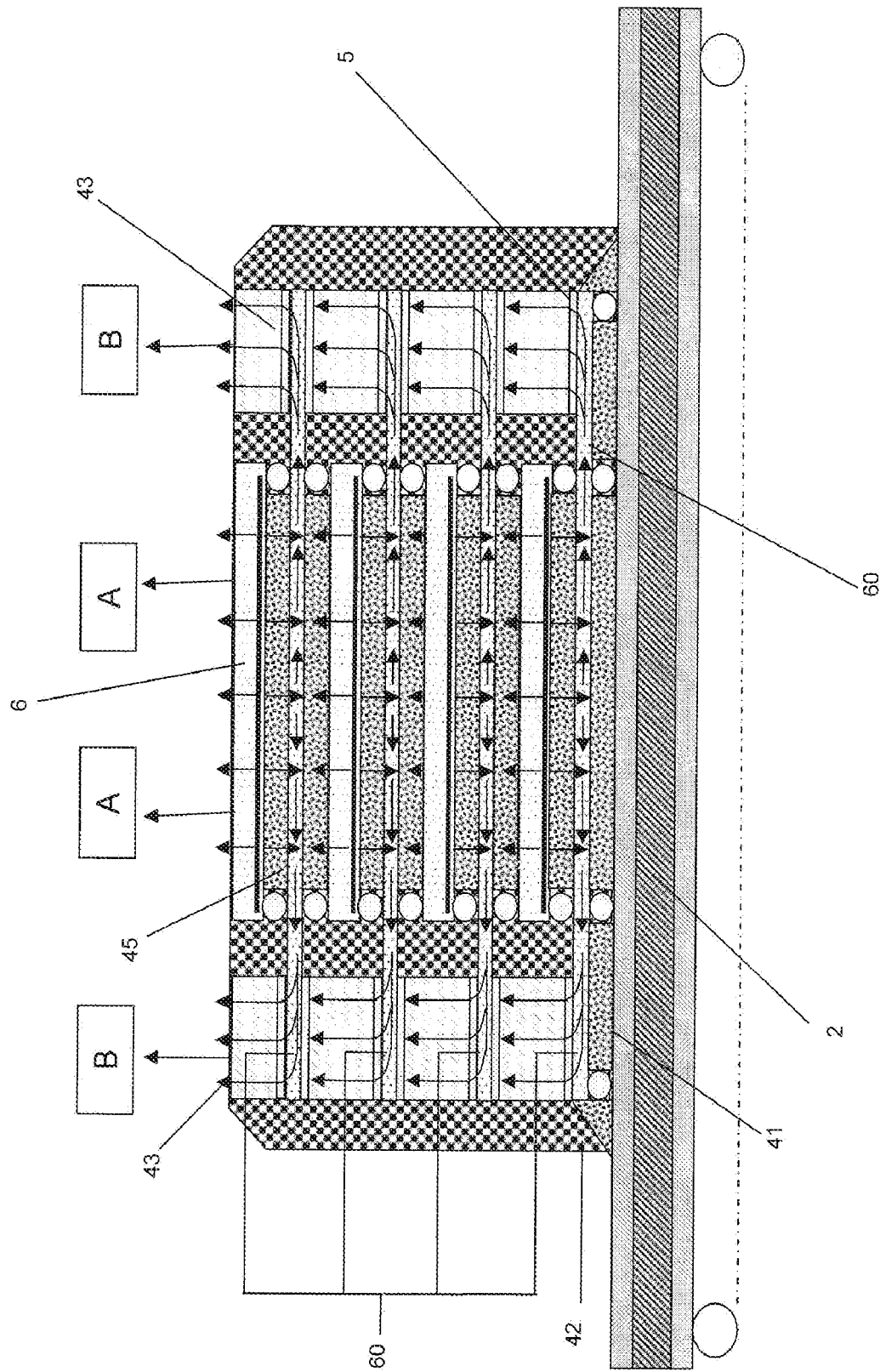
FIG. 9B illustrates another exemplary embodiment of an electronic package including multiple thermal interposers of the present invention with respect to each die stack.

FIGS. 9A and 9B illustrate other exemplary embodiments of the invention to address the common practice of stacking several dies on top of one another for space-saving purposes. Specifically, the heights of these types of structures are subject to larger variations than that of a single die system. When two or more dies are stacked on top of a silicon interposer, the solder connection height is not guaranteed to be uniform and lacks perfection, with height variations of up to 20 μm in height on a nominal C4 height of 100 μm.

When utilizing a thermal interposer, a heat sink surface needs to contact two distinct surfaces simultaneously. Because of the imperfection of the solder connections and the lack of uniformity in the height of the system, tolerance problems are caused. Further, thermal interface material might be inadvertently thicker in one region of the structure than in another in order to compensate for the lack of uniformity in height of the structure and make a quality connection with a heat sink.

While sounding like a practical solution to the uniformity issues, the inadvertent thickness difference in some areas of thermal interface material presents a very poor thermal solution with respect to accomplishing the goal of heat transfer from the several dies to the heat sink.

An exemplary embodiment of the present invention shown in FIG. 9A provides a solution to the aforementioned drawback. Specifically, several dies 6 are stacked on top of one another and ultimately on top of a thermal interposer 40 of the present invention. These dies 6 are attached to each other and to the thermal interposer 40 by several solder connections 44. The thermal interposer 40 is connected to an organic substrate 2 by solder connections 44. A device layer 13 is included in each of the several dies 6. A first underfill 41 is applied between the several dies 6 and between a bottom die of the several dies 6 and the thermal interposer 40. A second underfill 45 is applied between the organic substrate 2 and the thermal interposer 40.

FIG. 9B is an extension of the exemplary embodiment features in FIG. 9A. As shown in FIG. 9B, each die 6 is augmented with a thermal interposer 60 so that multiple conduction paths are provided in a die stack. This further enhances the thermal conductivity of the augmented path compared to that of the single thermal interposer 40 of FIG. 9A.

As in other exemplary embodiments shown in FIGS. 6 and 7, the thermal interposers 40 and 60 extend beyond the edges of the several dies 6. Thermal interface material 5 is deposited on a portion of the surface of the thermal interposers 40 and 60 that extend beyond the edges of the several dies 6.

However, vertical thermal pistons 43 formed of good conductive material are provided on top of the thermal interface material 5. The pistons 43 are formed by providing molded portions 42 surrounding the pistons 43. A molding compound is used to form the molded portions 42.

While heat energy is transferred to the heat sink (not shown) via the primary heat flux path A, the vertical thermal pistons 43 work in conjunction with the thermal interposers 40 and 60 to transport heat to the heat sink via the auxiliary heat flux path B. The molded portions 42 and the pistons 43 are level with a top surface of the uppermost die 6.

As is exemplary shown in FIGS. 9A and 9B, the vertical thermal pistons 43 accept heat energy that is transported from a bottom side of the stack of dies 6 to the thermal interposer 40 in FIG. 9A and a bottom side of each die 6 in a stack of dies to thermal interposers 60 in FIG. 9B. The thermal interposers 40 and 60 transfer the heat energy via the thermal interface material 5 to the vertical thermal pistons 43 that serve to form auxiliary heat flux path B and bring the heat energy to the top of the structure.

The molded portions 42 are molded and subsequently polished or leveled such that a flat, uniform surface for interface with a heat sink can be guaranteed. Thus, no excess amount of thermal interface material is needed to make up for the deformities of an imperfectly stacked system when interfacing with a heat sink. Furthers the stack system created buffers tolerance issues from a system integrator or an OEM manufacturer. In addition, all of the other benefits of the thermal interposer as discussed in previous exemplary embodiments, such as the ability to move temperature-sensitive structures to the periphery of a dies are also available within the present exemplary embodiment.

FIG. 10 illustrates an exemplary method 100 of manufacturing an electronic package with a thermal interposer of the present invention. The method includes forming a die including a thermal interface material through which a primary heat flux path is enabled for conducting heat from the die (101), forming an organic substrate (102), and forming a thermal interposer provided between the organic substrate and the die, the thermal interposer having an area extending beyond a footprint of the die, the area including the thermal interface material, the thermal interposer conducting heat generated by the die through the thermal interface material such that an auxiliary heat flux path for conducting heat generated in the die is enabled (103).

According to the exemplary method featured in FIG. 10, a thermal interposer is formed that extends beyond a footprint area of the die. This extension allows heat dissipated by the die to take two distinct heat flux paths. Thus, the thermal interposer of the present invention promotes and allows the escape of heat energy toward the auxiliary heat flux path in order to prevent the inadvertent transfer of heat energy to and trapping of heat energy in areas where heat energy is desired the least. Moreover, a quality location on the die can also be found for placing temperature-sensitive circuits due to the lower amount of heat dissipation occurring in the die and the distribution of heat management between the primary heat flux path and the auxiliary heat flux path.

While the invention has been described in terms of several exemplary embodiments, those skilled in the art will recognize that the invention can be practiced with modification within the spirit and scope of the appended claims. Furthers it is noted that Applicant's intent is to encompass equivalents of all claim elements, even if amended later during prosecution.

What is claimed is:

1. An electronic package, comprising:
a die comprising thermal interface material through which a primary heat flux path is enabled for conducting heat from said die;
an organic substrate;
a thermal interposer provided between said organic substrate and said die, said thermal interposer having an area extending beyond a footprint of said die, said area comprising thermal interface material through which an auxiliary heat flux path is enabled for conducting heat from said die, said thermal interposer conducting heat generated by said die through said thermal interface material of said die and said area; and
a device layer formed between said die and said thermal interposer, said auxiliary heat flux path reducing a temperature at a periphery of said device layer.

2. The electronic package according to claim 1, further comprising:
a temperature-sensitive circuit placed at a periphery of said die,
wherein said auxiliary heat flux path reduces a temperature at said periphery of said die.

3. The electronic package according to claim 1, wherein said primary heat flux path and said auxiliary heat flux path release heat to a heat sink.

4. The electronic package according to claim 1, wherein said thermal interface material of said die and said area of said thermal interposer interfaces with a heat sink.

5. The electronic package according to claim 1, wherein said thermal interposer comprises an interposer material having a coefficient of thermal expansion similar to that of silicon, a high thermal conductivity, and a suitability for one of chemical etching and drilling, and
wherein said coefficient of thermal expansion of said interposer material is substantially similar to a coefficient of thermal expansion of said die.

6. The electronic package according to claim 5, wherein said interposer material comprises silicon.

7. The electronic package according to claim 5, wherein said die and said organic substrate have a difference in coefficients of thermal expansion, and
wherein said thermal interposer mitigates stress inherently caused by said difference between said die and said organic substrate.

8. The electronic package according to claim 2, wherein a thickness of said thermal interposer is selected to adjust said temperature at said periphery of said die.

9. The electronic package according to claim 1, wherein a thermal conductivity of the auxiliary heat flux path is dependent upon a width of said thermal interposer.

10. An electronic package, comprising:
a die comprising thermal interface material through which a primary heat flux path is enabled for conducting heat from said die;
an organic substrate;
a thermal interposer provided between said organic substrate and said die, said thermal interposer having an area extending beyond a footprint of said die, said area comprising thermal interface material through which an auxiliary heat flux path is enabled for conducting heat from said die;
a device layer formed between said die and said thermal interposer, said auxiliary heat flux path reducing a temperature at a periphery of said device layer; and
an augmenting element formed on said thermal interface material of said area,
wherein said thermal interposer conducts heat generated by said die through said thermal interface material of said die and said area and said augmenting element.

11. The electronic package according to claim 10, wherein said augmenting element comprises a micro-channel cooler.

12. The electronic package according to claim 10, further comprising:
a temperature-sensitive circuit placed at a periphery of said die,
wherein said auxiliary heat flux path reduces a temperature at said periphery of said die.

13. The electronic package according to claim 10, wherein said primary heat flux path and said auxiliary heat flux path conduct heat to a heat sink.

14. The electronic package according to claim 10, wherein said thermal interface material of said die interfaces with a heat sink, and wherein said augmenting element interfaces with said heat sink.

15. An electronic package, comprising:

a plurality of dies stacked three-dimensionally through which a primary heat flux path is enabled for conducting heat from said plurality of dies;

an organic substrate; and a thermal interposer provided between said organic substrate and said plurality of dies, said thermal interposer having an area extending beyond a footprint of said plurality of dies, said thermal interposer comprising:

a thermal piston formed on a thermal interface material provided on a first portion of said area, said piston comprising highly conductive material; and a plurality of molded portions provided on a second portion of said area, said plurality of molded portions surrounding said piston, wherein said thermal interposer conducts heat generated by said plurality of dies through said thermal interface material and said thermal pistons such that an auxiliary heat flux path for conducting heat generated in said plurality of dies is enabled.

16. The electronic package according to claim 15, wherein said molded portions and said pistons are planar with a top surface of an uppermost die of said plurality of dies.

17. The electronic package according to claim 15, wherein said molded portions comprise one of a polished and leveled surface such that said molded portions have a uniform surface for interface with a heat sink.

18. The electronic package according to claim 15, further comprising:

a temperature-sensitive circuit placed at a periphery of said plurality of dies, wherein said auxiliary heat flux path reduces a temperature at said periphery of said plurality of dies.

19. The electronic package according to claim 15, further comprising:

a plurality of local thermal interposers provided underneath each of said plurality of dies, said plurality of local thermal interposers having areas extending beyond a footprint of said plurality of dies, wherein said plurality of local thermal interposers conduct heat generated by said plurality of said dies through said thermal interface material and said thermal piston such that an auxiliary heat flux path for conducting heat generated in said plurality of said die is enabled.

20. A method of manufacturing an electronic package, comprising:

forming a die comprising thermal interface material through which a primary heat flux path is enabled for conducting heat from said die;

forming an organic substrate;

forming a thermal interposer between said organic substrate and said die, said thermal interposer having an area extending beyond a footprint of said die, said area comprising thermal interface material through which an auxiliary heat flux path is enabled for conducting heat from said die, said thermal interposer conducting heat generated by said die through said thermal interface material of said die and said area; and, forming a device layer between said die and said thermal interposer, said auxiliary heat flux path reducing a temperature at a periphery of said device layer.

21. The method of manufacturing according to claim 20, further comprising:

forming a temperature-sensitive circuit at a periphery of said die, wherein said auxiliary heat flux path reduces a temperature at said periphery of said die.

22. The method of manufacturing according to claim 20, further comprising:

forming an augmenting element on said thermal interface material of said area, wherein said thermal interposer conducts heat generated by said die through said thermal interface material of said die and said area and said augmenting element.

23. The method of manufacturing according to claim 20, further comprising:

forming a plurality of dies stacked three-dimensionally through which said primary heat flux path is enabled for conducting heat from said plurality of dies, said plurality of dies comprising said die;

forming a thermal piston on said thermal interface material of said area, said thermal interface material of said area provided on a first portion of said area, said piston comprising highly conductive material; and forming a plurality of molded portions on a second portion of said area, said plurality of molded portions surrounding said piston, wherein said thermal interposer conducts heat generated by said plurality of dies through said thermal interface material of said die and said area and said thermal piston.

24. The electronic package according to claim 1, wherein a first portion of underfill surrounds a first surface of the thermal interposer, said first surface of the thermal interposer being connected to the organic substrate, and a second portion of underfill surrounds a connection between a second surface of the thermal interposer and the device layer.

25. The method of manufacturing according to claim 22, wherein forming said augmenting element comprises forming a micro-channel cooler on said thermal interface material of said area.

* * * * *